United States Patent [19]

Ueno

[11] Patent Number: 5,448,584
[45] Date of Patent: Sep. 5, 1995

[54] SEMICONDUCTOR LASER FOR USE AS LIGHT SOURCE IN DATA PROCESSING DEVICE WITH CLADDING LAYERS HAVING A BANDGAP TWICE AS LARGE AS THE ACTIVE LAYER

[75] Inventor: Yoshiyasu Ueno, Tokyo, Japan
[73] Assignee: NEC Corporation, Tokyo, Japan
[21] Appl. No.: 223,784
[22] Filed: Apr. 6, 1994
[30] Foreign Application Priority Data
  Apr. 6, 1993 [JP] Japan .................................. 5-078437
[51] Int. Cl.⁶ .............................................. H01S 3/18
[52] U.S. Cl. ......................................... 372/45; 372/96
[58] Field of Search ....................... 372/45, 96, 43, 44; 257/13

[56] References Cited

U.S. PATENT DOCUMENTS

| 4,803,690 | 2/1989 | Takiguchi et al. | 372/96 |
| 4,992,837 | 2/1991 | Sukai et al. | 372/45 |
| 5,008,891 | 4/1991 | Morita | 372/45 |

FOREIGN PATENT DOCUMENTS 63-280484 11/1988 Japan .

OTHER PUBLICATIONS

By T. Furuse et al., "Internal Second Harmonic Generation In InGaAsP DH Lasers", Optics Communications, Dec. 1980, vol. 35, No. 3, pp. 413–416.
By K. Kobayashi et al., "632.7 nm CW Operation (20° C.) of AlGaInP Visible Laser Diodes Fabricated on (001) 6° off toward [110] GaAs Substrate", Japanese Journal of Applied Physics, Sep. 1990, vol. 29, No. 9, pp. 1669–1671.

Primary Examiner—Rodney B. Bovernick
Assistant Examiner—Robert McNutt
Attorney, Agent, or Firm—Young & Thompson

[57] ABSTRACT

A semiconductor laser with a semiconductor multilayer has at least one double heterostructure. There area pair of cladding layers and an active layer and, where a bandgap energy of the cladding layers is $E_1$ and that of the active layer is $E_2$, these bandgap energies satisfy a relation substantially $E_1 \geq 2 \times E_2$. The semiconductor laser produces green SHG (second harmonic generation) light and the efficiency of producing such light is high because the cladding layers absorb substantially no SHG light.

4 Claims, 1 Drawing Sheet

SEMICONDUCTOR LASER FOR USE AS LIGHT SOURCE IN DATA PROCESSING DEVICE WITH CLADDING LAYERS HAVING A BANDGAP TWICE AS LARGE AS THE ACTIVE LAYER

BACKGROUND OF THE INVENTION

1. Field of the Invention

The present invention relates to a semiconductor laser, and more particularly to a semiconductor laser used as a light source for a data processing device.

2. Description of the Related Art

A semiconductor laser which is extremely compact and highly adapted to high volume production is widely used as light sources for various advanced optoelectronic devices in the fields of such as data or information processing and optical communication. Among the information processing means, the compact disks (CD) and optomagnetic disks are particularly important as means for storing and reproducing digital information as music or other data. The memory capacity in such information processing means increases as the wavelength of a light source becomes shorter. Thus, a semiconductor laser with a shorter wavelength is being actively researched. The shortest wavelength in a recent semiconductor laser which has practical characteristics is in the order of 830 nm as disclosed by Kobayashi et al in the Japanese Journal of Applied Physics, Vol. 29, No 9, September, 1990, pp. L1669–L1671.

A semiconductor laser light source with even a shorter wavelength than the above is being researched, but no sufficient practical characteristics have been obtained as yet. A semiconductor laser in which II–VI mixed crystal semiconductor is used operates only under a very low temperature in the order of 200° C. below zero. A semiconductor laser light source in which a semiconductor laser, a solid laser crystal and a second harmonic generation (SHG) crystal are combined produces light of a green to a blue color, but such laser light source is more voluminous and less adapted to high volume production as compared with a discrete type semiconductor lasers.

The second harmonic generation (SHG) is based on a principle of generating a laser beam having half the wavelength of the original laser beam so that, for example, the generation of a semiconductor laser SHG having an oscillation wavelength shorter than about 1.2 μm enables to produce a beam having a wavelength shorter than about 600 nm. There are reports wherein, without using SHG crystals, some attempts have been made to take out the SHG of a shorter wavelength from a discrete semiconductor laser. Disclosed in Japanese Patent Application Kokai Publication No. Sho 63(1988)-280484 is a semiconductor device in which an SHG crystal layer comprised of ZnSSe is provided on a crystal surface of a surface emitting type AlGaAs laser which produces an oscillation beam of 0.82 μm whereby an SHG beam of 0.41 μm is produced. Also, disclosed in the Journal of Optical Communication, Volume 35, No. 3, pp. 413–416 (1980) is an example wherein a 0.65 μm red SHG beam of 0.15 nW has been produced in a Fabry-Perot type InGaAsP laser which produces an oscillation beam of 1.3 μm.

In the above semiconductor device disclosed in Japanese Patent Application Kokai Publication No. Sho 63(1988)-280484, a ZnSSe layer for SHG is provided on an n-type AlGaAs contact layer of a buried type surface emitting laser structure having a double heterostructure in which a GaAs active layer is sandwiched between an n-type AlGaAs cladding layer and a p-type AlGaAs cladding layer. Since this semiconductor device employs a surface emitting laser structure, there are difficulties in lengthening the optical path length long and in obtaining a strong SHG beam.

Also, the above example disclosed in the Journal of Optical Communication relates to the observation of an SHG beam in a PCW (Plano-Convex Waveguide) laser in which, in a laminated structure, an n-type $In_{0.9}Ga_{0.1}As_{0.22}P_{0.78}$ plano-convex waveguide layer is sandwiched between an $In_{0.7}Ga_{0.4}As_{0.55}P_{0.45}$ active layer and an n-type InP substrate and in which a p-type InP cladding layer is further provided on the active layer. The PCW laser is a facet emitting type so that the optical path length is longer as compared with that of a surface emitting type. However, a problem therein is that, since the SHG light is extensively absorbed by the cladding layers, it is not possible to obtain a laser beam having a strong power.

SUMMARY OF THE INVENTION

An object of the present invention, therefore, is to overcome the problems existing in the prior art and to provide a short wavelength semiconductor laser capable of generating SHG beam efficiently.

Another object of the present invention is to enable generating a green SHG beam from a discrete semiconductor laser.

According to one aspect of the invention, there is provided a semiconductor laser with a semiconductor multi-layer having at least one double heterostructure comprising:

a pair of cladding layers whose bandgap energy is $E_1$; and an active layer whose bandgap energy is $E_2$, the active layer being sandwiched between the pair of cladding layers, the bandgap energy $E_1$ and the bandgap energy $E_2$ being such that a relation substantially ($E_1 \geq 2 \times E_2$) is satisfied.

In the semiconductor laser according to the invention, the electrons and holes that are injected into the active layer are luminously recombined resulting in the generation of oscillation light having an energy of about $E_2$ (wavelength $\lambda_2$). At this time, the light density within the laser resonator is so high as about 100 MW/cm². The active layer exposed to such a very strong oscillation light generates, due to a secondary non-linearity effect, an SHG beam having an energy of $E_s = 2 \times E_2$ and a wavelength of $\lambda_2 = \lambda_2/2$. The efficiency in the generation of the SHG beam in the semiconductor laser according to the invention is high because the SHG beam having an energy $E_s$ smaller than the bandgap energy $E_1$ of the cladding layers which occupy most of the volume of the laser resonator is not or little absorbed by the cladding layers.

With the semiconductor laser according to the invention, it is possible to generate efficiently a green SHG beam having a wavelength of 540 nm. The SHG beam has a monochromatic property similar to that of a 1.08 μm oscillation beam of a semiconductor laser and, since the phase of the SHG beam is matched to the phase of the oscillation beam, it is possible to make the converging thereof almost to the diffraction limit by means of optical lens system.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the accompanying drawings.

Figure 1:
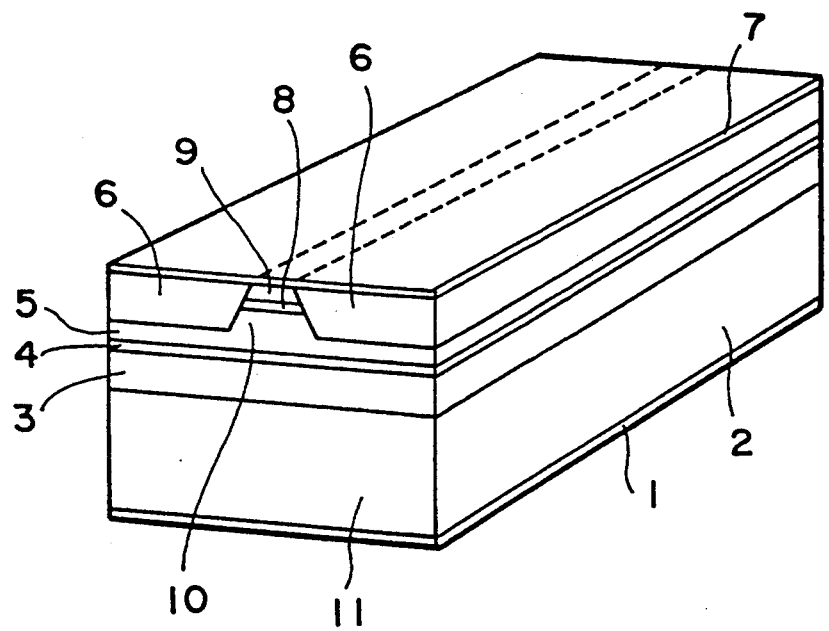
FIG. 1 is a perspective view of a semiconductor laser of a first embodiment according to the invention.

FIG. 1 shows, in a perspective view, a semiconductor laser of a first embodiment according to the invention. On an Si-doped n-type GaAs semiconductor substrate 2, there are sequentially provided an si-doped n-type $(Al_{0.7}Ga_{0.3})_{0.5}In_{0.5}P$ cladding layer 3 having a thickness of 2 μm, an InGaAs active layer 4, a Zn-doped p-type $(Al_{0.7}Ga_{0.3})_{0.5}In_{0.5}P$ cladding layer 5 having a thickness of 2 μm, a Zn-doped p-type GaInP layer 8 having a thickness of 50 nm, and doped p-type GaAs layer 9 having a thickness of 0.3μm. The above InGaAs active layer 4 is formed of a two-layer 7 nm undoped $In_{0.35}Ga_{0.85}As$ quantum well layer with the two layers being separated by a 4 nm thick undoped $(Al_{0.7}Ga_{0.3})_{0.5}In_{0.5}P$ quantum barrier layer. The bandgap energy ($E_2$) of the $In_{0.35}Ga_{0.65}As$ quantum well layer is about 1.07 eV. The energy of the oscillation light resulted from the stimulated emission at the $In_{0.35}Ga_{0.65}As$ quantum well layer is about 1.15 eV which is slightly larger than the bandgap energy of 1.07 eV due to a quantum effect and the wavelength of the oscillation light is about 1.08 μm. The energy ($E_s$) of the SHG light produced then is 2.30 eV with the wavelength ($\lambda_s$) being 540 nm. Since the InGaAs active layer 4 reabsorbs the SHG light a little, a sufficiently thin active layer has been used in the embodiment of the invention. Also, since the InGaAs active layer 4 is under lattice strain, it is important for the InGaAs active layer 4 to be thin for purposes of preventing the occurrence of grating defects. The InGaAs active layer 4 may be an undoped InGaAs quantum well single layer. The bandgap energy ($E_1$) of $(Al_{0.7}Ga_{0.3})_{0.5}In_{0.5}P$ cladding layer is 2.32 eV and satisfies a relation $E_1 \geq 2 \times E_2$, $E_1 \geq E_s$. There, no or almost no SHG light is absorbed by the $(Al_{0.7}Ga_{0.3})_{0.5}In_{0.5}P$ cladding layer. The GaInP layer is inserted in order to alleviate a large bandgap energy difference between the AlGaInP cladding layer 5 and the GaAs layer 9 thereby enhancing injection of carriers.

The epitaxial growth was performed using a Metal-Organic Vapor Phase Epitaxy (MOVPE) method. In this embodiment, the crystal growth temperature was 650° C.~750° C. and the pressure was 70 Torr. The source materials used are trimethylaluminum, trimethylgallium, trimethylgallium, trimethylindium, dimethylzinc, phosphine, arsine and disilane. The epitalial growth can be performed using other methods, such as a Gas-Source Molecular Beam Epitaxy (GSMBE) method and a Chemical Beam Epitaxy (CBE) method.

Subsequent to the epitaxial growth, a mesa in a stripe shape is formed simultaneously in all thee layers, namely, the AlGaInP cladding layer 5, the GaInP layer 8 and the GaAs layer 9, by using a photolithography process and a chemical etching process, whereby an optical waveguide 10 is formed (see FIG. 1). The formation of the mesa is followed by selective growth of a blocking layer 6 on either side of the mesa, the blocking layer 6 being Si-doped n-type $(Al_xGa_{1-x})_{0.5}In_{0.5}P$ layer $(0.7 < X \leq 1.0)$. An appropriate difference in the index of refraction between the blocking layer 6 and the AlGaInP cladding layer 5 stabilizes the fundamental lateral mode oscillation. The blocking layer 6 also plays a role of efficiently injecting carriers to a center portion of the optical waveguide 10. As the blocking layer 6, it is also possible to use a multi-layer film of an n-type GaAs layer/n-type GaInP layer. In such a case, the thickness of each of the GaAs layer and the GaInP layer may be such that it is about ¼× of the wavelength at each layer in the laminate direction of the oscillation light and may be configured in a semiconductor Bragg reflector structure with multi-layers being alternately laminated. In this way, since the blocking layer 6 has a high reflectivity to the laser light, it is possible to obtain an appropriate and effective refraction index difference for the optical waveguide.

Further steps are to form an upper electrode 7 and a lower electrode 1, to cleave the resulting structure thereby forming a pair of laser facets 11, and to form lastly a dielectric multi-layer film (not shown) on each of the front facet and the rear facet. This completes the fabrication of the semiconductor laser as shown in FIG. 1. The cavity or resonator length is 800 μm and thus the optical path length which affects the non-linearity optical effect is sufficiently long. The dielectric multi-layer is designed such that the reflectivity thereof is close to 100% with respect to the oscillation light of 1.08 μm. The SHG light which has a wavelength (540 nm) half the wavelength of the oscillation light is transmitted through the dielectric multi-layer film and is emitted from the semiconductor laser.

Figure 2:
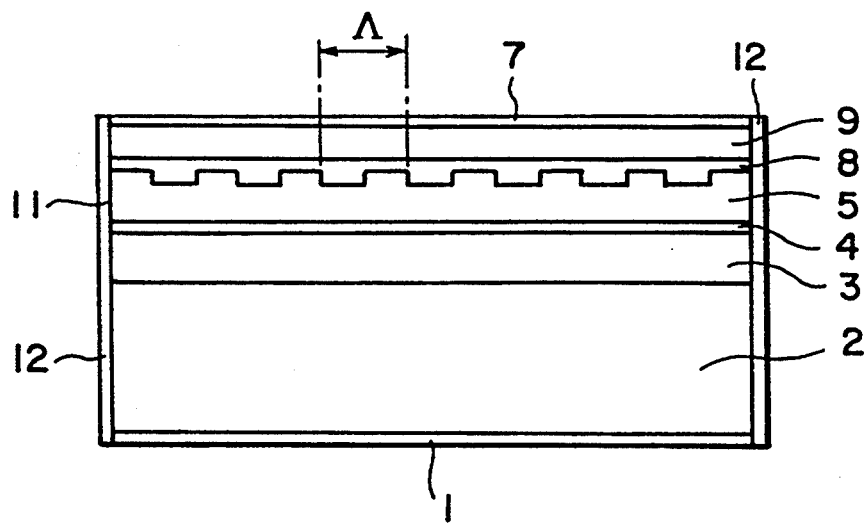
FIG. 2 is a diagrammatic sectional view of a semiconductor laser of a second embodiment according to the invention.

FIG. 2 shows, in a sectional view, a semiconductor laser of a second embodiment of the invention. First, grown epitaxially on an n-type GaAs substrate 2 are an n-type AlGaInP cladding layer 3, an InGaAs active layer 4, and a p-type AlGaInP cladding layer 5 similarly as in the first embodiment. After the epitaxial growth, the p-type AlGaInP cladding layer 5 is subjected to a photolithography and a chemical etching process whereby an upper portion of the p-type AlGaInP cladding layer 5 is shaped into a plano-convex form in a regular period Λ as seen in FIG. 2. The function of the plano-convex form is to match the phases of the oscillation light (wavelength $\lambda_p$) and the SHG light (wavelength $\lambda_s$) and to enhance the luminous efficiency of the second harmonic generation. That is, where the wavenumbers of the oscillation light and the SHG light in the axial direction of the optical waveguide 10 are respectively $k_p$ and $k_s$, the phases are matched by selecting an appropriate period Λ to satisfy the following relation:

$$k_s = 2 \cdot k_p + 2\pi m / \Lambda \quad (m = +1, +2, ...)$$

wherein m is made m = +1 and Λ is made Λ = 0.68 μm. The principle in this formula is similar to that in the Quasi-Phase Matching (QPM) which has already been demonstrated and known in respect of a niobium lithium waveguide.

After the formation of the plano-convex surface, a p-type GaInP layer 8 and a p-type GaAs layer 9 are formed by an epitaxial growth method. Further processes are, as in the first embodiment, to form sequentially a mesa in a stripe shape, a blocking layer 6, an electrode 7 and an electrode 1, a laser facet 11, and a dielectric multi-layer film 12. This completes the fabrication of the semiconductor laser of the second embodiment.

In the above embodiments, materials such as InGaAs and AlGaInP are used but other such semiconductor materials as used in semiconductor lasers may well be used. Also, the waveguide structure itself is not among the features of the invention so that it may employ any waveguide structure including that of PCW (Plano-Convex Waveguide).

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor laser with a semiconductor multi-layer having at least one double heterostructure comprising:
   a pair of cladding layers whose bandgap energy is $E_1$; and
   an active layer whose bandgap energy is $E_2$, said active layer being sandwiched between said pair of cladding layers,
   said bandgap energy $E_1$ and said bandgap energy $E_2$ being such that a relation substantially $(E_1 \geqq 2 \times E_2)$ is satisfied.

2. A semiconductor laser according to claim 1, in which one of said pair of cladding layers has a thickness which changes in a constant period in an axial direction of a laser cavity.

3. A semiconductor laser according to claim 2, in which said active layer includes an InGaAs layer and said cladding layers are of AlGaInP.

4. A semiconductor laser according to claim 1, in which said active layer includes an InGaAs layer and said cladding layers are of AlGaInP.

* * * * *